(12) United States Patent
Nishioka et al.

(10) Patent No.: US 6,469,516 B2
(45) Date of Patent: *Oct. 22, 2002

(54) METHOD FOR INSPECTING CAPACITORS

(75) Inventors: Yoshinao Nishioka, Shiga-ken (JP); Mitsuru Kitagawa, Yokaichi (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/441,485

(22) Filed: Nov. 17, 1999

(65) Prior Publication Data

US 2002/0060571 A1 May 23, 2002

(30) Foreign Application Priority Data

Dec. 4, 1998 (JP) ............................................. 10-346109
Dec. 8, 1998 (JP) ............................................. 10-348347

(51) Int. Cl.[7] ......................... H01H 31/04; G01R 27/26; G01N 27/00
(52) U.S. Cl. ....................... 324/548; 324/658; 324/677; 324/678; 324/71.1; 324/659
(58) Field of Search ................ 324/548, 658, 324/677, 678, 71.1, 659

(56) References Cited

U.S. PATENT DOCUMENTS

| | | | | |
|---|---|---|---|---|
| 3,715,656 A | * | 2/1973 | Hyde et al. | 324/678 |
| 4,216,424 A | * | 8/1980 | Vette | 324/659 |
| 5,936,409 A | * | 8/1999 | Nishioka | 324/548 |
| 6,043,665 A | * | 3/2000 | Nishioka et al. | 324/678 |
| 6,275,047 B1 | * | 8/2001 | Zoellick et al. | 324/678 |

FOREIGN PATENT DOCUMENTS

| | | |
|---|---|---|
| JP | 7-128399 | 5/1995 |
| JP | 8-94684 | 4/1996 |
| JP | 10221396 | 8/1998 |

* cited by examiner

*Primary Examiner*—N. Le
*Assistant Examiner*—Wasseem H. Hamdan
(74) *Attorney, Agent, or Firm*—Ostrolenk, Faber, Gerb & Soffen, LLP

(57) ABSTRACT

In a method for judging the conformity or non-conformity of a capacitor from the charging characteristic at the time when a direct-current voltage is applied to the capacitor, a threshold current value $I_0$ of the dielectric polarization component of the capacitor is determined in advance, an evaluation function n(t) is determined based on a logarithmic value of the difference between the measured charging current value m(t) of the capacitor and the threshold current value $I_0$ or the difference between their logarithmic values, and the evaluation function n(t) is approximated to a quadratic curve. When the quadratic coefficient of the quadratic approximation equation has a plus sign the capacitor is judged to be non-conforming, and when the coefficient has a minus sign, the capacitor is conforming.

3 Claims, 5 Drawing Sheets

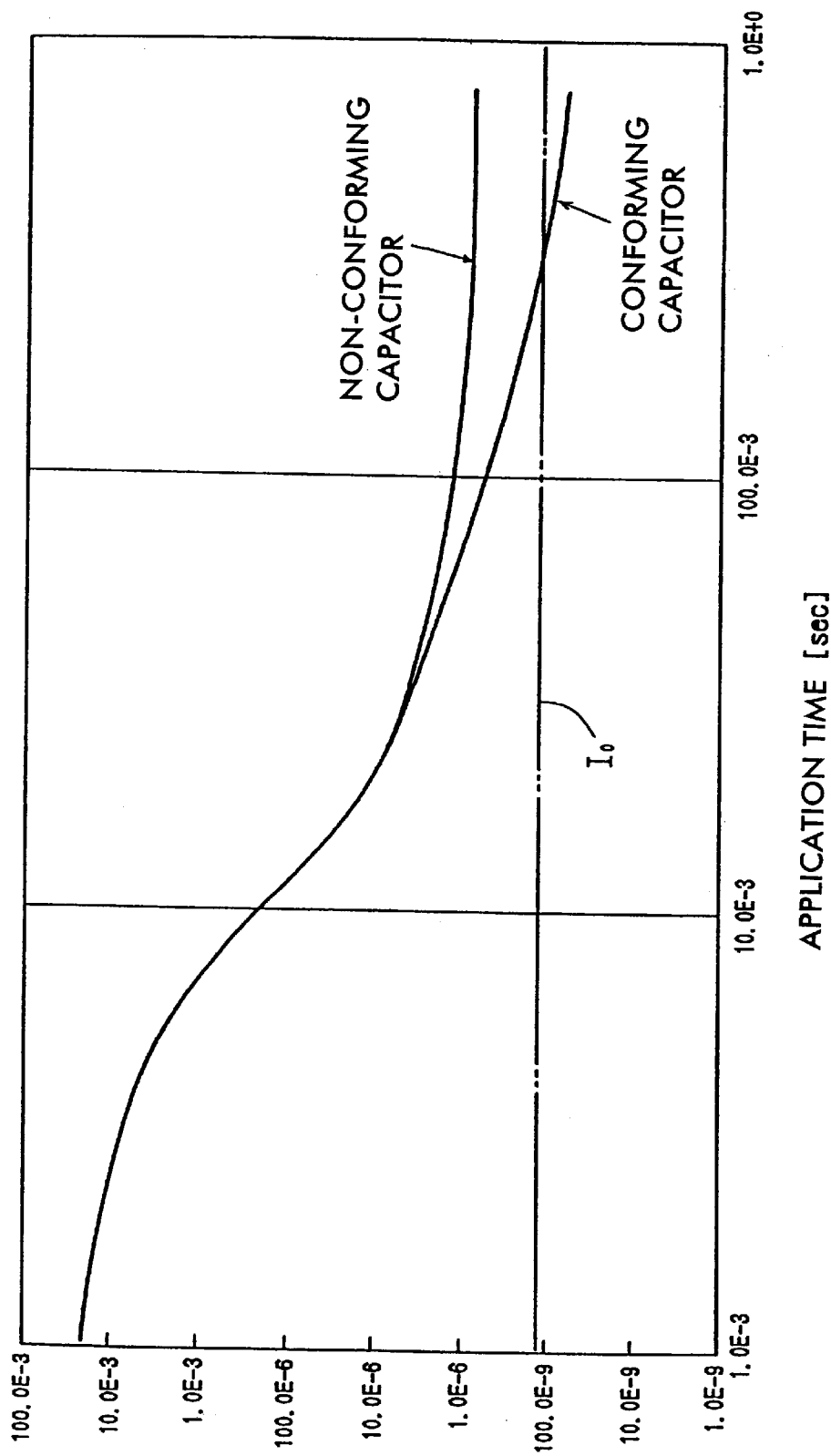

METHOD FOR INSPECTING CAPACITORS

BACKGROUND OF THE INVENTION

1. Field of the Invention

The present invention relates to a method for inspecting capacitors and more particularly to a method for judging the conformity or non-conformity of capacitors based on the charging characteristic at the time when a direct-current voltage is applied to the capacitors.

2. Description of the Related Art

Generally, in order to judge the conformity or non-conformity of capacitors, a method for measuring the insulation resistance of capacitors in such a way that a leakage current (charging current) of capacitors is measured after a direct-current voltage for measurement is applied to the capacitors and the capacitors have been fully charged is known. Usually, conforming capacitors show little leakage current.

Up to now, as such a method for measuring charging current a measurement system specified in JIS C 5102 is known. In this system, because it is required to measure the current value under the condition that capacitors are fully charged, a measuring time of about 60 seconds was needed. However, the need for cost reduction and reliability improvement of electronic equipment requires an improvement of production capacity and quality of electronic parts such as capacitors, and therefore, the conventional measurement system which needs such a long measuring time for each capacitor cannot satisfy such a requirement in the long run.

Therefore, so far, as a simple inspection method the conformity or non-conformity of capacitors was judged by measuring the current value in a fixed time after a direct-current voltage was applied to the capacitors and comparing the measured current value with a threshold value. However, in such an inspection method, because it is judged whether the measured current value is below the threshold value or not, the voltage is required to be applied till the measured current value becomes greater than the threshold value, and accordingly a long time of a few seconds to tens of seconds was needed.

SUMMARY OF THE INVENTION

It is an object of the present invention to provide an inspection method in which the conformity or non-conformity of capacitors can be judged in a short time.

In order to attain the above object, the present invention provides a method for inspecting capacitors in which the conformity or non-conformity of capacitors is judged by the charging current at the time when a direct-current voltage is applied to the capacitors, the method comprising the steps of establishing a threshold current value $I_0$ of the capacitors, formulating an evaluation function using the logarithmic value of the difference between the measured current value $m(t)$ of a dielectric polarization component of the capacitors and the above threshold current value $I_0$ or the difference between their logarithmic values, and judging the conformity or non-conformity of the capacitors based on whether the above evaluation function $n(t)$ results in a line curved upward or downward with respect to a change of logarithmic time.

Other features and advantages of the present invention will become apparent from the following description of the invention which refers to the accompanying drawings.

BRIEF DESCRIPTION OF THE DRAWING

FIG. 3 shows the time dependence of the measured current value of conforming and non-conforming capacitors;

DETAILED DESCRIPTION OF EMBODIMENTS OF THE INVENTION

Figure 1:
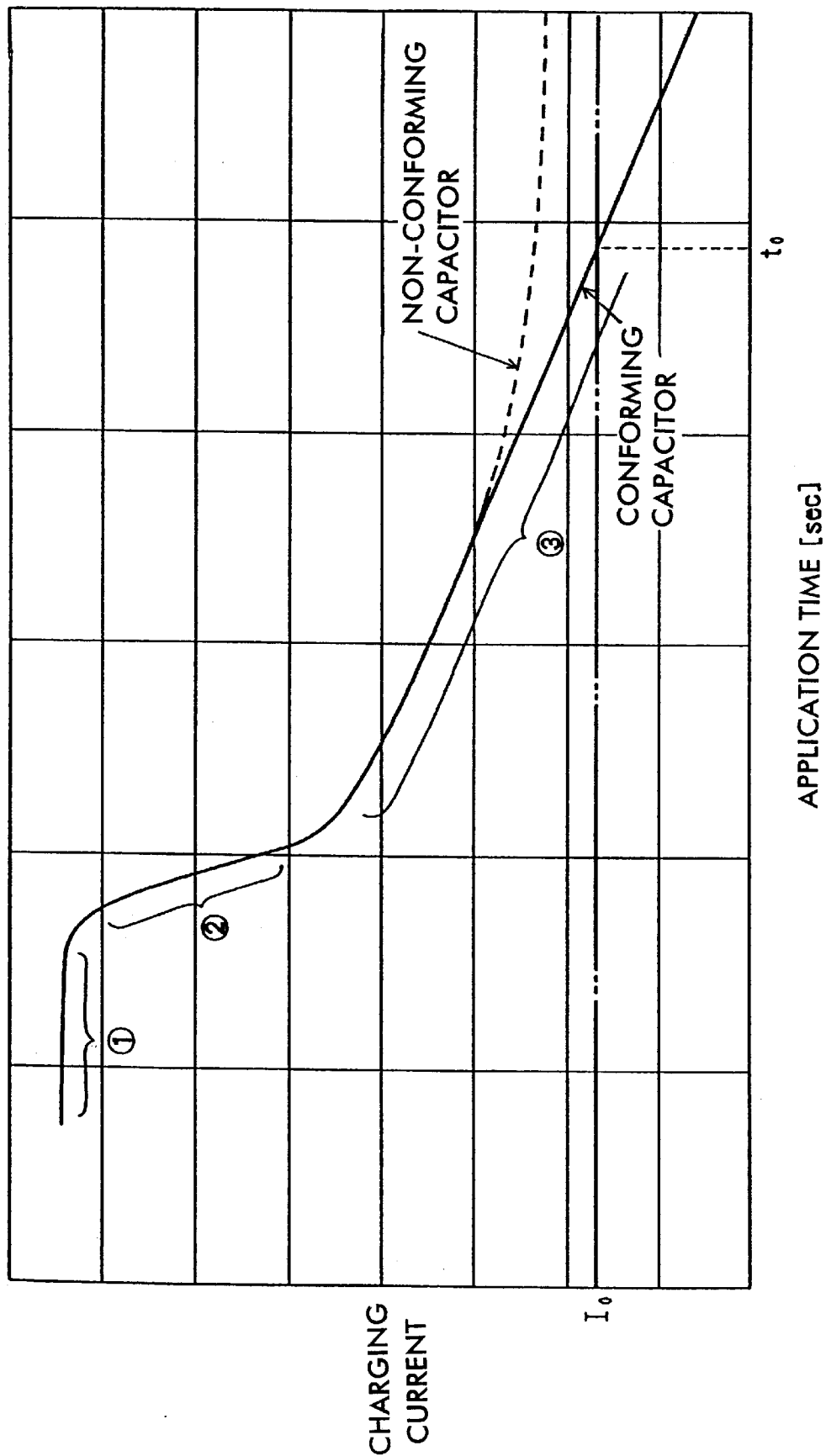
FIG. 1 shows the change of charging current of conforming and non-conforming capacitors.

In accordance with the present invention, it has been found that when a direct-current voltage was applied to capacitors, the change of the current value with time, plotted in the co-ordinate system of logarithmic current and logarithmic time, resulted in the characteristic shown by the solid line in FIG. 1. That is, although a nearly constant large current flows for an initial short charging period 1), the current value sharply drops in the following transitional period 2) and then the current lowers to show a linear charging characteristic. This linear characteristic 3) extended till one to two minutes after the start of the charge.

Figure 2:
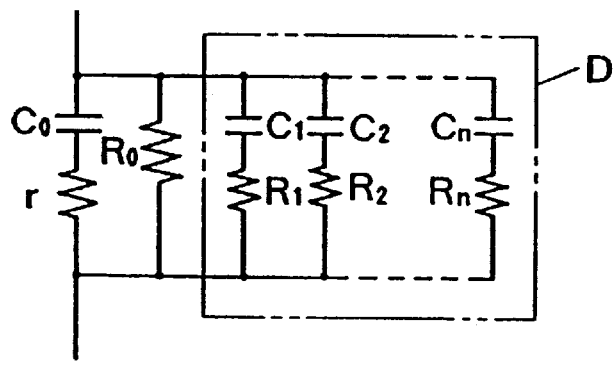
FIG. 2 shows an equivalent circuit of capacitors.

When the above characteristic has been further examined, the following fact became clear. That is, the equivalent circuit of capacitors consists of a capacitance $C_0$, an internal resistance r, an insulation resistance $R_0$, and a dielectric polarization component D as shown in FIG. 2, and although the initial charging characteristic 1) corresponds to the charge of the capacitance $C_0$, it was found that the linear charging characteristic 3) represents the charge of the dielectric polarization component D.

Conforming capacitors, as a matter of course, have a charging characteristic nearly in accord with the linear charging characteristic 3) in FIG. 1. On the contrary, non-conforming capacitors have a charging characteristic which is nearly along the linear charging characteristic 3) for the initial period of the charge, but in which the rate of the lowering current value is reduced with elapsed time as shown by a broken line in FIG. 1. Generally, it is in a few seconds after the application of voltage that the difference between conforming and non-conforming capacitors becomes clear. However, the indications are clearly seen in tens of milliseconds after the application of voltage. That is, when the difference between the measured current value of non-conforming capacitors and the measured current value of conforming capacitors is taken, a slowly widening tendency in a positive direction is seen.

Then, according to the present invention, a threshold current value $I_0$ is established in advance as shown by a two-dot chain line in FIG. 1, and an evaluation function $n(t)$ is formulated using the logarithmic value of the difference between the measured current value $m(t)$ of a dielectric polarization component of measuring capacitors and the above threshold current value $I_0$ or the difference between their logarithmic values.

That is, $$n(t) = \log\{m(t) - I_0\} \quad (1)$$

$$n(t) = \log m(t) - \log I_0 \quad (2)$$

More, the logarithm can be either a common logarithm or a natural logarithm, or any other logarithm can be used. The conformity or non-conformity of capacitors is judged based on whether the evaluation function n(t) draws a line curved upward or downward with respect to a change of logarithmic time log t. That is, because the line curved upward means the evaluation function n(t) rapidly decreases with elapsed logarithmic time, the capacitors are judged as a conforming one, and because the line curved downward means the evaluation function n(t) does not change very much with elapsed logarithmic time, then the capacitors are judged as a non-conforming one.

When such an inspection method is used, the conformity or non-conformity can be quickly judged before the difference between conforming and non-conforming capacitors becomes clear. In the past, because the conformity or non-conformity was judged based on whether the measured current value of capacitors had been greater than a threshold value $I_0$ or not, the conformity or non-conformity could not be judged before the measured current value and the threshold value $I_0$ intersected with each other at the time of $t_0$ (see FIG. 1), but according to the present invention, the conformity or non-conformity can be judged prior to the time of $t_0$ when the measured current value of capacitors and the threshold $I_0$ intersect (for example, in hundreds of milliseconds after the application of voltage).

In order to judge whether the evaluation function n(t) draws a line curved upward or downward, it is simple, for example, to approximate the evaluation function n(t) to a quadratic curve and judge a plus or minus sign of the quadratic coefficient of the quadratic approximation equation. That is, let log t=x, and n(t)=y Then the evaluation function n(t) is approximated to an approximation equation of $y=dx^2+ex+f$ When the quadratic coefficient d of the quadratic approximation equation has a plus sign, the resulting line is curved downward and the capacitor is judged as a non-conforming one. On the contrary, when the quadratic coefficient d of the quadratic approximation equation has a minus sign, the resulting line is curved upward and the capacitor is judged as a conforming one. Further, using a method of quadratic approximation, even if the value of the evaluation function n(t) temporarily fluctuates, since the total tendency can be grasped, it is possible to make a stable judgement of whether a capacitance is conforming or non-conforming.

A threshold current value $I_0$ can be determined by a threshold value $R_0$ (For example, 10 MΩ) which is dependent on the kind of capacitors and an applied voltage.

$I_0$=applied voltage/$R_0$

The threshold value $R_0$ is determined, for example, by the specification (100 ΩF or higher) of capacitors in JIS C 6429-1996. For example, in the case of 10 μF in capacitance, an insulation resistance of 10 MΩ or more is required, and accordingly $R_0$ becomes 10 MΩ.

Figure 4:
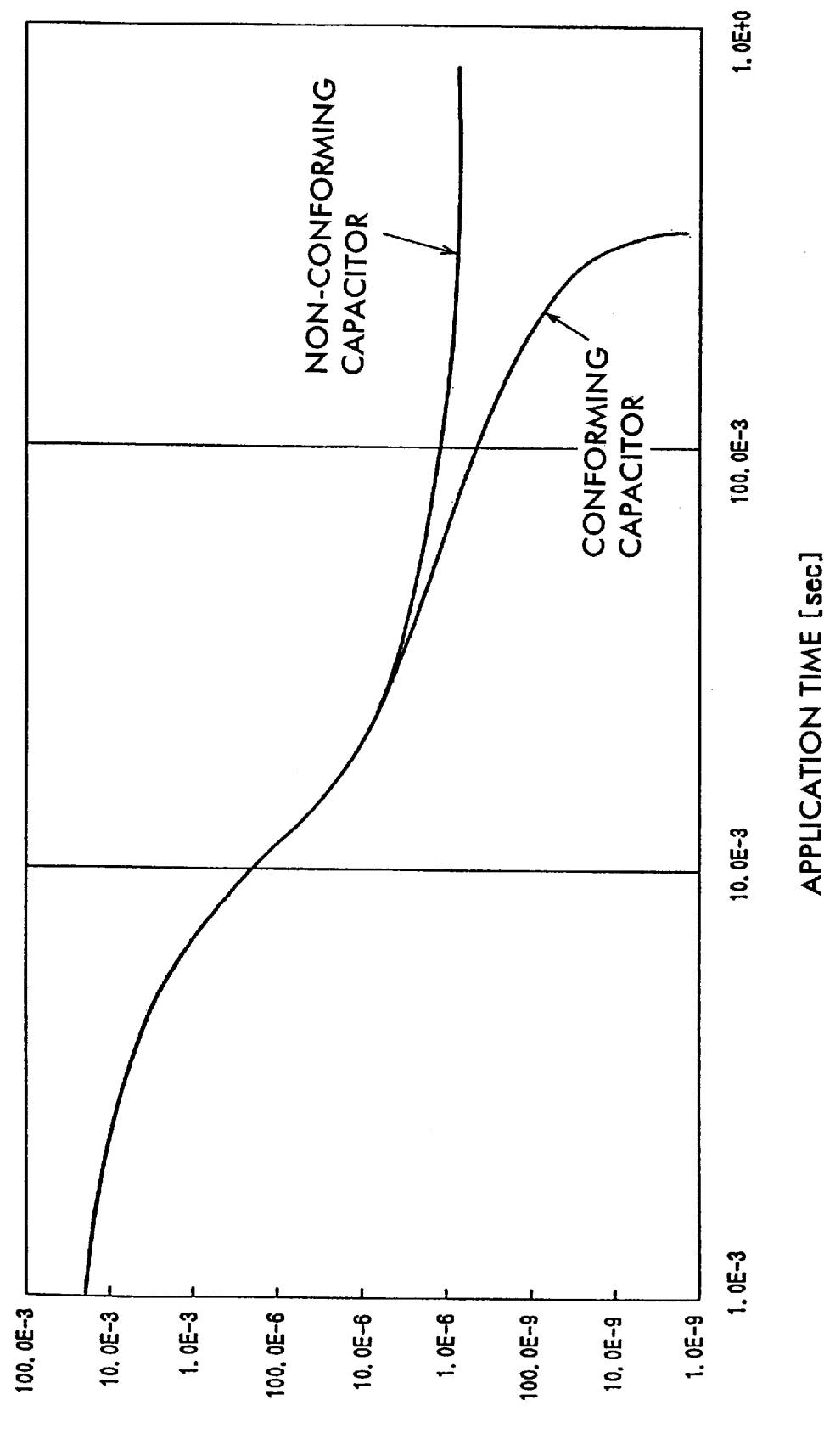
FIG. 4 shows the time dependence of the difference between the measured current value and a threshold current value of conforming and non-conforming capacitors.

In FIG. 3, the time dependence of the charging current value m(t) of actual conforming and non-conforming capacitors is shown using a logarithmic scale. In FIG. 4, the time dependence of the difference m(t)-$I_0$ between the current value m(t) obtained using the capacitors of the characteristics in FIG. 3 and a threshold current value $I_0$ is shown in a logarithmic coordinate system.
Here, $I_0$ =126×10$^{-9}$ (A)
As clearly seen in FIG. 4, the evaluation function n(t)=log {m(t)-$I_0$} of non-conforming capacitors draws a line curved downward, but n(t) of conforming capacitors draws a line curved upward. Furthermore, the difference between them can be already seen in about 0.05 seconds.

Figure 5:
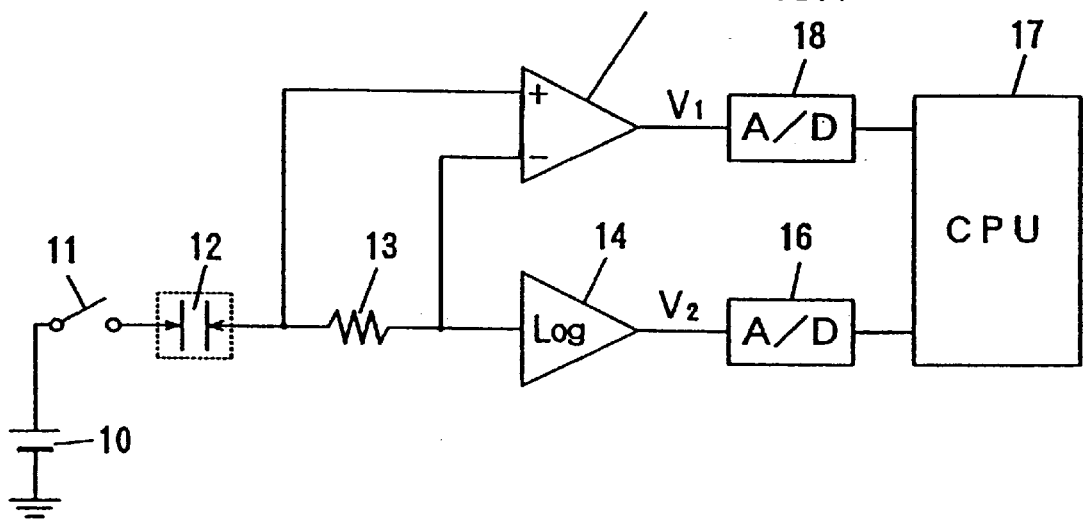
FIG. 5 is a circuit diagram of one example of a current measuring device.

FIG. 5 shows one example of a current measuring device as an embodiment of the present invention. The measuring device is composed of a direct-current measurement power supply 10, a switch 11, a capacitor as a measuring object 12, a limiting resistor 13, a logarithmic amplifier 14, an instrumentation amplifier 15, analog-to-digital converters 16 and 18, and a central processing unit (CPU) 17. At the initial stage of charging, the current value is measured by the amplifier for measurement 15, the amplifier is changed to the logarithmic amplifier 14 at a fixed threshold value and after that the current value is measured by the logarithmic amplifier 14. Even if the charging current of the capacitor 12 varies in a wide range, the measuring device can measure the current correctly and is accordingly characterized in that the device can continuously measure the current value at the initial to last stage of charging as in FIG. 3 which was difficult for a conventional measuring device to measure. More, in the present invention the measuring device shown in FIG. 5 is not necessarily required to be used, but also other measuring devices may be used.

Figure 6:
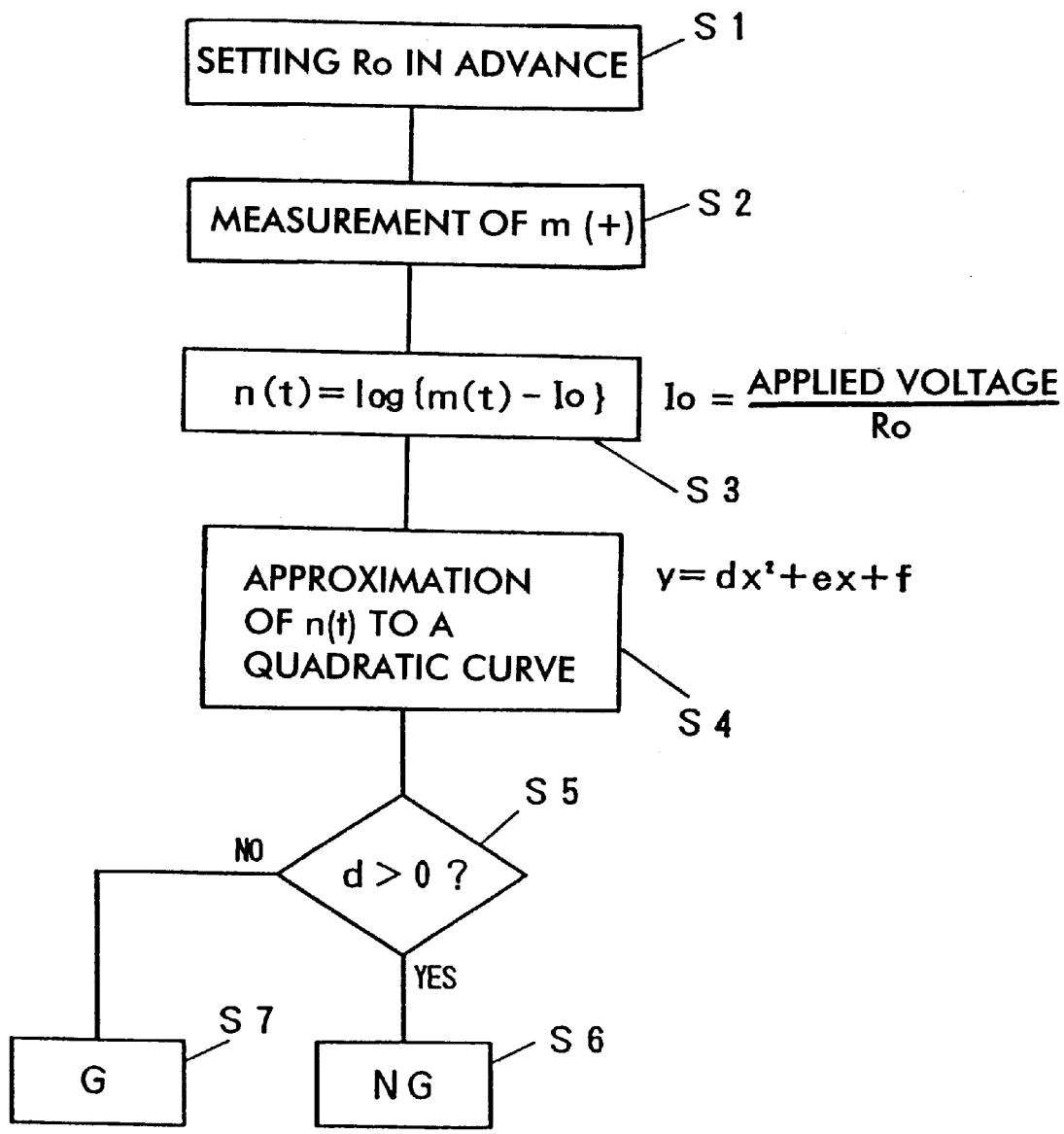
FIG. 6 is a flow chart of one example of an inspection method according to the present invention.

Next, the total flow of an inspection method according to the present invention is explained based on FIG. 6.

First, the insulation resistance $R_0$ is set at a fixed value (for example, 10 MΩ, and so on) dependent on the kind of capacitors. (Step S1)

Next, the actual current value m(t) at the initial stage of charging (for example, in 0.1 to 1 second) is measured. (Stage S2)

Next, the evaluation function n(t) is sought based on the logarithm of the difference between the actually measured current value m(t) and a threshold current value $I_0$ (=applied voltage/$R_0$). (Step S3)

Next, n(t) is approximated to a quadratic curve. (Step S4)
That is, let log t=x, and n(t)=y
Then the evaluation function n(t) is approximated to an approximation equation of $y=dx^2+ex+f$ Next, it is judged whether the quadratic coefficient d of the quadratic approximation equation $y=dx^2+ex+f$ has a plus or minus sign. (Step S5)

When d has a plus sign, it is judged that the capacitor is non-conforming. (Step S6)

And if d has a minus sign, it is judged that the capacitor is conforming. (Step S7)

In the above explanation, the evaluation function n(t) was set to be a logarithmic value of the difference between the measured current value m(t) and a threshold current value $I_0$ but n(t) may be set to be the difference between their logarithmic values. That is, let n(t)=log m(t)–log $I_0$. Then approximating this n(t) to a quadratic curve ends in the same result.

More, capacitors which can be inspected in accord with the present invention are any capacitors having a dielectric polarization component, such as ceramic capacitors, electrolytic capacitors, film capacitors, and so on.

As made clear in the above explanation, according to the invention, as the conformity or non-conformity of capacitors is judged in such a way that an evaluation function is formulated based on the logarithmic value of the difference between the measured current value of a dielectric polarization component of capacitors and a threshold current value or the difference between their logarithmic values and it is judged whether the evaluation function which is time-dependent draws a line curved upward or downward, the conformity or non-conformity can be judged in a very short time of hundreds of milliseconds without waiting for a few seconds after the application of voltage. Therefore, the efficiency of judging the conformity or non-conformity of capacitors can be noticeably increased in comparison with conventional methods.

Further, when an evaluation function is approximated to a quadratic curve and the conformity or non-conformity of capacitors is judged by a plus or minus sign of the quadratic coefficient of the quadratic approximation equation, the judgement of conforming capacitors can be very simple. Furthermore, if a method of quadratic approximation is used, the total tendency can be grasped and a stable judgement of conforming capacitors can be made without being affected by temporary noise.

While the invention has been particularly shown and described with reference to preferred embodiments, it will be understood by those skilled in the art that the foregoing and other changes in form and details can be made without departing from the spirit and scope of the invention.

What is claimed is:

1. A method for inspecting a capacitor to determine the conformity or non-conformity of the capacitor, comprising the steps of:

(a) establishing, other than by calculation, a threshold current value $I_0$ for the capacitor;

(b) applying a direct-current voltage to the capacitor;

(c) measuring the charging current m(t) of the capacitor;

(d) formulating an evaluation function n(t) using a logarithmic value of the difference between the measured current value m(t) and the threshold current value $I_0$ or the difference between their logarithmic values; and (e) judging the conformity or non-conformity of the capacitor based on whether the above evaluation function n(t) draws a line curved upward or downward with respect to a change of logarithmic time.

2. A method for inspecting a capacitor as claimed in claim 1, wherein step (e) includes approximating the evaluation function n(t) to a quadratic curve and judging whether the quadratic coefficient of the quadratic approximation equation is plus or minus.

3. A method for inspecting a capacitor as claimed in claim 1 or 2, wherein the threshold current value $I_0$ is determined by an insulation resistance based on the kind of capacitor.

* * * * *